United States Patent
He et al.

(10) Patent No.: US 10,573,375 B1
(45) Date of Patent: Feb. 25, 2020

(54) METHODS AND CIRCUITRY FOR PROGRAMMING NON-VOLATILE RESISTIVE SWITCHES USING VARISTORS

(71) Applicant: Intel Corporation, Santa Clara, CA (US)

(72) Inventors: Yue-Song He, San Jose, CA (US); Rusli Kurniawan, Belmont, CA (US); Richard G. Smolen, Redwood City, CA (US); Christopher J. Pass, San Jose, CA (US); Andy L. Lee, Sunnyvale, CA (US); Jeffrey T. Watt, Palo Alto, CA (US); Anwen Liu, Santa Clara, CA (US); Alok Nandini Roy, San Jose, CA (US)

(73) Assignee: Intel Corporation, San Jose, CA (US)

( * ) Notice: Subject to any disclaimer, the term of this patent is extended or adjusted under 35 U.S.C. 154(b) by 0 days.

(21) Appl. No.: 16/114,892

(22) Filed: Aug. 28, 2018

(51) Int. Cl.
*G11C 11/413* (2006.01)
*G11C 11/23* (2006.01)
(Continued)

(52) U.S. Cl.
CPC ............ *G11C 11/413* (2013.01); *G11C 11/23* (2013.01); *G11C 13/003* (2013.01);
(Continued)

(58) Field of Classification Search
CPC ..... G11C 11/413; G11C 11/23; G11C 13/003; G11C 13/004; G11C 13/0069; H01L 4516/08
See application file for complete search history.

(56) References Cited

U.S. PATENT DOCUMENTS 7,838,863 B2    11/2010   Zhao et al.
7,871,866 B2 *   1/2011   Jeong ................... G11C 13/003
                                                    257/E47.001
(Continued)

FOREIGN PATENT DOCUMENTS

WO    2017195509    11/2014
WO    2017064744     4/2017

OTHER PUBLICATIONS

Miyamura et al., "Low-power Programmable-logic Cell Arrays using Nonvolatile Complementary Atom Switch" Low-power Electronics Association & Project (LEAP), Onogawa, Japan, 15th International Symposium on Quality Electronic Design (ISQED), Mar. 2014, DOI: 10.1109/ISQED.2014.6783344.

(Continued)

*Primary Examiner* — Tri M Hoang
(74) *Attorney, Agent, or Firm* — Treyz Law Group; Jason Tsai

(57) ABSTRACT

Integrated circuits with an array of programmable resistive switch elements are provided. A programmable resistive switch element may include two non-volatile resistive memory elements connected in series and two varistors. A first of the two varistors is used to program a top resistive memory element in the resistive switch element, whereas a second of the two varistors is used to program a bottom resistive memory element in the resistive switch element. Row and column drivers implemented using only thin gate oxide transistors are used to program a selected resistive switch in the array without violating a maximum voltage level that satisfies predetermined defects per million (DPM) reliability criteria.

20 Claims, 12 Drawing Sheets

(51) Int. Cl.
*G11C 13/00* (2006.01)
*H01L 45/00* (2006.01)

(52) U.S. Cl.
CPC ........ *G11C 13/004* (2013.01); *G11C 13/0069* (2013.01); *H01L 45/1608* (2013.01)

(56) References Cited

U.S. PATENT DOCUMENTS

| | | | |
|---|---|---|---|
| 8,072,237 B1 | 12/2011 | Rahim et al. | |
| 8,144,498 B2 | 3/2012 | Kumar et al. | |
| 8,441,837 B2* | 5/2013 | Ikeda | G11C 13/0007 365/148 |
| 8,816,312 B2* | 8/2014 | Tada | G11C 13/0007 257/1 |
| 8,830,727 B2 | 9/2014 | Yi et al. | |
| 8,890,567 B1 | 11/2014 | Lewis | |
| 8,981,332 B2 | 3/2015 | Chiang et al. | |
| 9,112,138 B2 | 8/2015 | Ramaswamy et al. | |
| 9,419,220 B2 | 8/2016 | Ramaswamy et al. | |
| 9,461,649 B2 | 10/2016 | Cong et al. | |
| 9,589,615 B2 | 3/2017 | Kulkarni et al. | |
| 10,090,840 B1* | 10/2018 | Lee | G06F 17/5027 |
| 10,269,426 B2* | 4/2019 | Smolen | G11C 5/14 |
| 2016/0163979 A1* | 6/2016 | Lee | H01L 45/145 257/4 |
| 2017/0331480 A1 | 11/2017 | Bai et al. | |

OTHER PUBLICATIONS

Smolen et al., U.S. Appl. No. 15/624,413, filed Jun. 15, 2017.
Lee et al., U.S. Appl. No. 15/637,726, filed Jun. 29, 2017.
Tada et al., "Highly Reliable, Complementary Atom Switch (CAS) with Low Programming Voltage Embedded in Cu BEOL for Non-volatile Programmable Logic", Low-power Electronics Association & Project (LEAP), Onogawa, Japan, IEDM Tech. Dig., p. 689 (2011).
Miyamura et al., "First Demonstration of Logic Mapping on Non-volatile Programmable Cell Using Complementary Atom Switch" Low-power Electronics Association & Project (LEAP), Onogawa, Japan IEDM Tech. Dig., p. 247 (2012).
Okamoto, et al., "Bidirectional TaO-Diode-selected, Complementary Atom Switch (DCAS) for Area-efficient, Nonvolatile Crossbar Switch Block" Low-power Electronics Association & Project (LEAP), Onogawa, Japan, VLSI Tech Dig., p. 242 (2013).
Banno, et al., "A Novel Two-Varistors (a-Si/SiN/a-Si) selected Complementary Atom Switch (2V-1CAS) for Nonvolatile Crossbar Switch with Multiple Fan-outs", Low-power Electronics Association & Project (LEAP), Onogawa, Japan, IEDM Tech. Dig., IEDM p. 32 (2015).
Banno et al., "50x20 Crossbar Switch Block (CSB) with Two-Varistors (a-Si/SiN/a-Si) selected Complementary Atom Switch for a highly-dense Reconfigurable Logic", Low-power Electronics Association & Project (LEAP), Onogawa, Japan, IEDM Tech. Dig p. 424 (2016).

* cited by examiner

US 10,573,375 B1

METHODS AND CIRCUITRY FOR PROGRAMMING NON-VOLATILE RESISTIVE SWITCHES USING VARISTORS

BACKGROUND

Integrated circuits such as programmable integrated circuits often contain volatile memory elements in the form of static random access memory (SRAM) cells. In programmable integrated circuits, SRAM cells may serve as configuration random access memory (CRAM) cells. Programmable integrated circuits are a type of integrated circuit that can be programmed by a user to implement a desired custom logic function. CRAM cells are used to store configuration data supplied by the user. Once loaded, CRAM cells supply control signals to transistors to configure the transistors to implement the desired logic function.

Volatile memory elements such as SRAM and CRAM cells are typically formed using a pair of cross-coupled inverters. In each memory cell, the pair of cross-coupled inverters may be connected to an address transistor that is turned on when data is being read from or written into the memory cell. When no data is being read from or written into the memory cell, the address transistor is turned off to isolate the memory cell.

There is a trend with each successive generation of integrated circuit technology to scale transistors towards smaller sizes, lower threshold voltages, and lower power supply voltages. Lower power supply voltages and smaller devices may lead to decreased read/write margins for volatile memory elements. This can pose challenges for reliable device operation.

Moreover, smaller devices tend to suffer more from process, voltage, and temperature variations (PVT variations). Operating the memory elements at lower power supply voltages can further exacerbate the amount of variation experienced by the memory elements, resulting in reduced memory yield.

It is within this context that the embodiments described herein arise.

DETAILED DESCRIPTION

The present embodiments relate to integrated circuits that include programmable switch elements. The programmable switch elements may be formed using non-volatile resistive elements and can be configured to form any desired connection on an integrated circuit.

Figure 1:
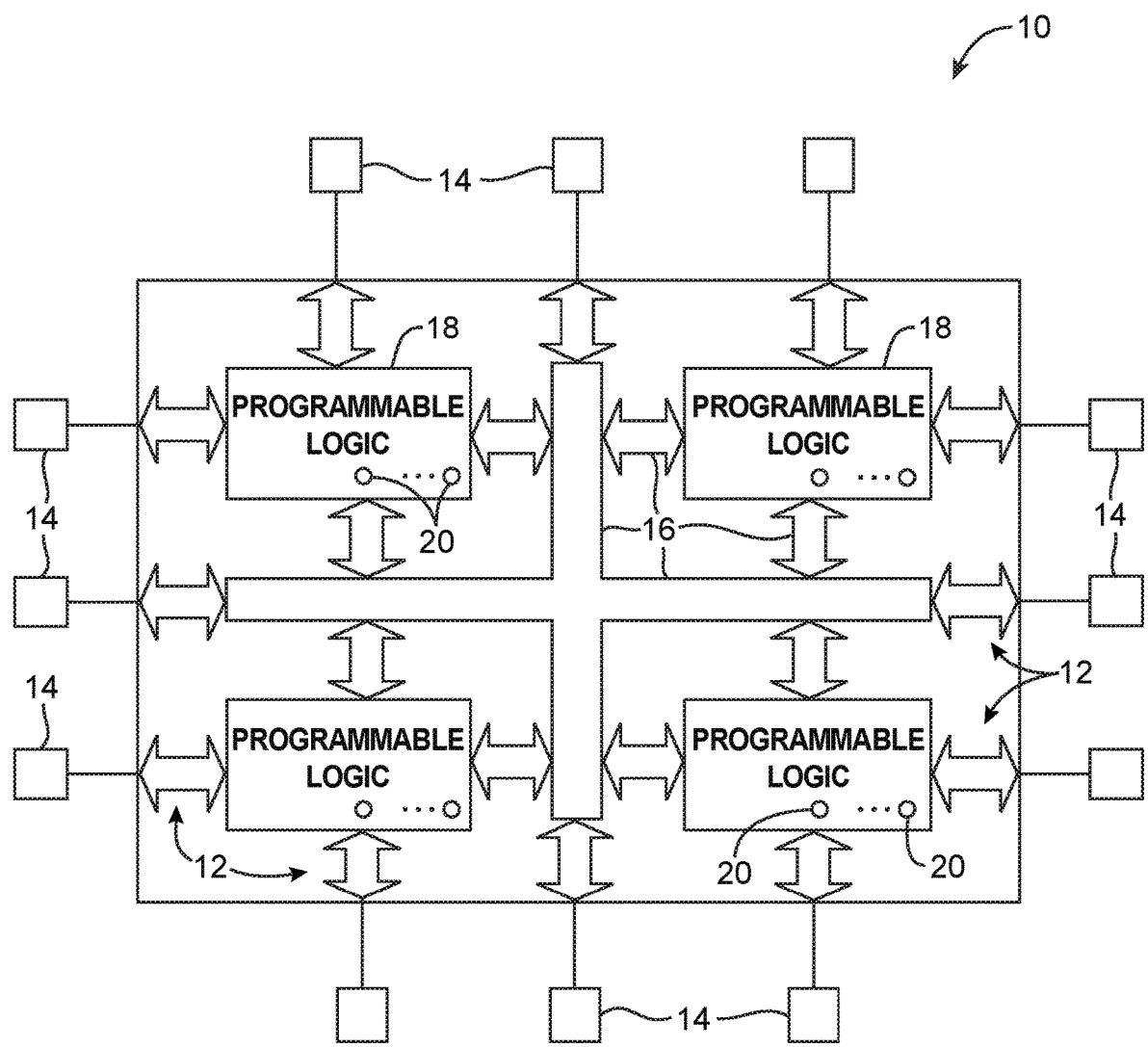
FIG. 1 is a diagram of an illustrative programmable integrated circuit in accordance with an embodiment.

An illustrative integrated circuit 10 that includes programmable switch elements is shown in FIG. 1. Device 10 may have input-output (I/O) circuitry 12 for driving signals off from device 10 and for receiving signals from other devices via input-output pins 14.

Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Device 10 contains programmable elements 20. Conventionally, these programmable elements are implemented using configuration random-access memory (CRAM) cells that can be loaded with configuration data using pins 14 and input-output circuitry 12. Once loaded, the configuration memory cells can provide corresponding static control output signals that control the state of an associated logic component in programmable logic 18. Typically, these CRAM memory cells may be used in SRAM-type memory arrays (e.g., to store data for processing circuitry during operation of device 10).

Figure 2:
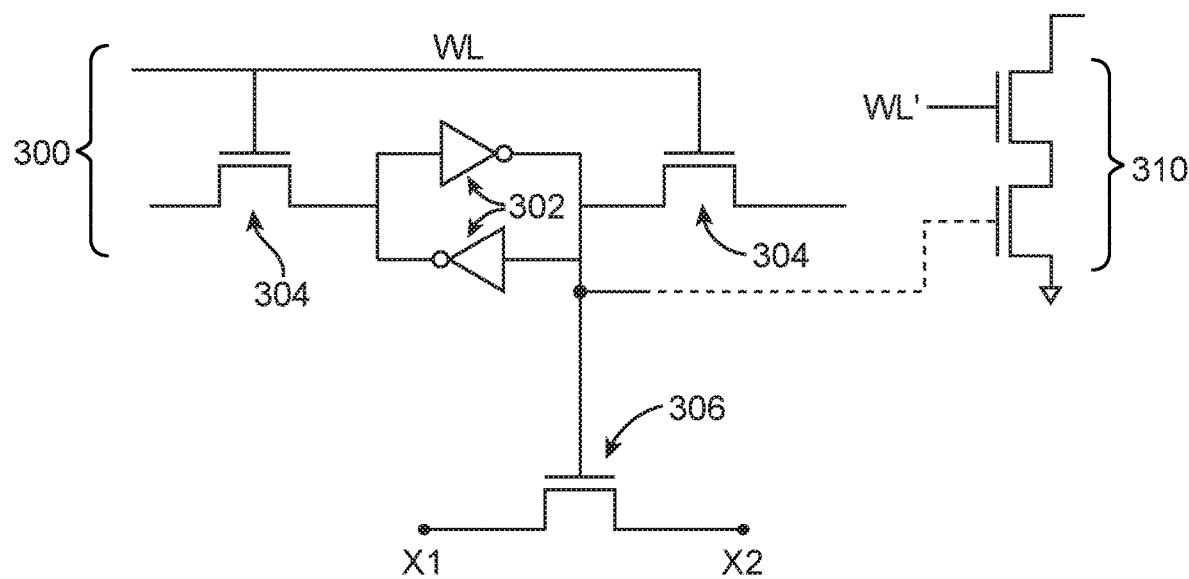
FIG. 2 is a diagram of a configuration random-access memory (CRAM) cell that controls a routing pass gate.

A CRAM cell is formed from a number of transistors configured to form a bistable circuit (see FIG. 2). As shown in FIG. 2, CRAM cell 300 includes cross-coupled inverters 302 connected to access transistors 304. Access transistors 304 are controlled by a word line signal WL for loading data into cell 300 or for reading data out from cell 300. Cell 300 may optionally be read using a read buffer circuit 310. Read buffer circuit 310 may include a first transistor that receives an additional word line signal WL' and a second transistor that is coupled to the bistable circuit. This is merely illustrative. In general, cell 300 may have a 6-transistor configuration, an 8-transistor configuration, a 10-transistor configuration, or other suitable memory cell architecture.

Loaded CRAM memory cell 300 provides a static control signal that is applied to a gate terminal of a corresponding pass gate such as pass transistor 306. If transistor 306 receives a static logic "1" at its gate terminal, user signals will be conveyed from terminal X1 to terminal X2. If, however, transistor 306 receives a static logic "0" at its gate terminal, no signals can flow from terminal A to terminal B via transistor 306. By loading the desired configuration data into cell 300, pass transistor 306 can be selectively turned on or off to configure the logic in programmable logic 18.

CRAM cell 300 of FIG. 2 is a volatile memory element. A volatile memory element retains data only so long as the integrated circuit is powered. In the event of power loss, the data in the volatile memory element is lost. Volatile memory elements are subject to a phenomenon known as soft error upset ("SEU"). Soft error upset events are caused by cosmic rays and radioactive impurities embedded in integrated circuits and their packages. Cosmic rays and radioactive impurities generate high-energy atomic particles such as neutrons and alpha particles. The memory elements contain transistors and other components that are formed from a patterned silicon substrate. When an atomic particle strikes the silicon in the memory element, electron-hole pairs are generated. The electron-hole pairs create a conduction path that can cause a charged node in the memory element to discharge and the state of the memory element to flip. If, for example, a logic "1" was stored in the memory element, an SEU event could cause the logic "1" to change to a logic "0".

Upset events in an integrated circuit corrupt the data stored in the memory elements and can have serious repercussions for system performance and system functionality. In certain system applications, such as remote installations of telecommunications equipment, it is extremely burdensome to repair faulty equipment. Unless integrated circuits demonstrate good immunity to soft error upset events, they will be unsuitable for these types of applications.

Figure 3:
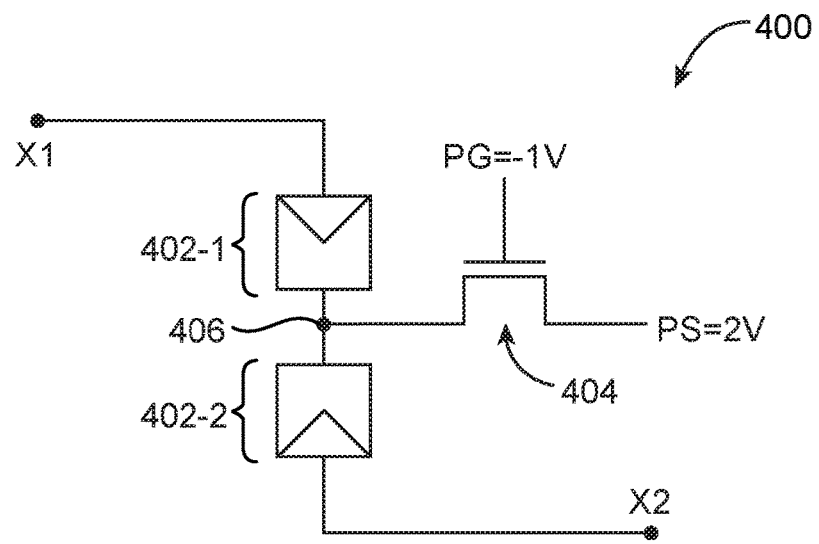
FIG. 3 is a diagram of an illustrative resistive switch element that is programmed using a metal-oxide-semiconductor transistor in accordance with an embodiment.

In accordance with an embodiment, integrated circuit device 10 is provided with programmable elements 20 implemented using non-volatile resistive memory elements (e.g., memory elements that retain their state regardless if device 10 is supplied with power). FIG. 3 is a diagram of an illustrative programmable resistive switch element such as switching element 400 in accordance with an embodiment. As shown in FIG. 3, programmable resistive switch element 400 may include a first non-volatile resistive memory element 402-1 and a second non-volatile resistive memory element 402-2 coupled in series between a first terminal X1 and a second terminal X2.

In particular, resistive element 402-1 may have a first (anode) terminal that is connected to terminal X1 and a second (cathode) terminal that is connected to intermediate node 406. Resistive element 402-2 may have a first (anode) terminal that is connected to terminal X2 and a second (cathode) terminal that is connected to node 406. This arrangement in which the cathode of resistive element 402-1 is connected to and facing the cathode of resistive element 402-2 is sometimes referred to as a "back-to-back" configuration.

An access transistor such as metal-oxide-semiconductor (MOS) transistor 404 may be coupled between a data line (e.g., a data line on which programming source voltage PS is provided) and node 406. Transistor 404 may be activated using programming gate signal PG help program switch 400 in a desired state. Transistor 404 is therefore sometimes referred to as a programming transistor or a select transistor.

Switch 400 configured in this way may replace the entire CRAM and pass gate combination shown in FIG. 2. Compared to the circuitry of FIG. 2 (which includes at least six transistors in CRAM cell 300 and one additional pass gate transistor 306), switch 400 of FIG. 3 includes only three components (e.g., programming transistor 404 and resistive elements 402-1 and 402-2) and may therefore occupy less circuit area. Programmable switch 400 may, as an example, be part of a routing multiplexer for routing active user signals from a first logic region to a second logic region on the integrated circuit (e.g., from a first logic region connected to terminal X1 to a second logic region connected to terminal X2), part of a programmable switch in a lookup table, or part of other configurable logic circuitry 18 on the integrated circuit. In other words, terminals X1 and X2 and resistive memory elements 402-1 and 402-2 are directly interposed in the user data path. Since terminals X1 and X2 lie along the user data path, they cannot be tied to fixed power supply lines.

Each resistive memory element 402 (e.g., resistive elements 402-1 and 402-2) may be a two-terminal electrochemical metallization memory device that relies on redox reactions to form (i.e., to "program") or to dissolve (i.e., to "erase") a conductive filament between the two terminals. The presence of a conductive filament between the two terminals produces a low resistance state (LRS), whereas the absence of the conductive filament between the two terminals produces a high resistance state (HRS). In LRS, the resistive element is sometimes referred to as being shorted or closed (i.e., activated, programmed, or "set"). In the HRS, the resistive element is sometimes referred to as being open or deactivated (i.e., switched out of use, erased, or "reset").

Resistive element 402 configured in this way is sometimes referred to as a programmable metallization cell (PMC) or a conductive-bridging RAM (CBRAM). If desired, magnetic RAM elements, other types of resistive RAM elements (RRAM), might also be used. A programmable switch configured using PMC elements in this way may exhibit nonvolatile behavior, soft error upset immunity, and zero standby current. Moreover, by connecting two resistive elements in series, the voltage level across each resistive element is halved during normal use, which reduces the possibility of accidentally setting or resetting each resistive element.

Switch 400 may either be configured in a first conducting mode to conduct signals between terminals X1 and X2 or in a second non-conducting mode to prevent signals from flowing between terminals X1 and X2. To configure switch 400 in the first mode, both elements 402-1 and 402-2 need to be set (i.e., both resistive elements should be in the low resistance state). To configure switch 400 in the second non-conducting mode, at least one or both of elements 402-1 and 402-2 need to be reset (i.e., at least one or preferably both resistive elements should be in the high resistance state).

As an example, a programming voltage of 3 V may be required to set and reset elements 402-1 and 402-2. To provide such 3 volt bias, a positive voltage of +3 V and a ground voltage of 0 V may be used to program the resistive memory elements. In order to withstand such high voltage levels, however, the driver circuits that are used to supply the +3 volt bias will need to be formed using thick gate oxide transistors. Typically, input-output circuits (e.g., I/O circuits 12 of FIG. 1) are formed using input-output transistor devices having relatively thicker gate oxides compared to the core transistor devices so that the I/O transistors are able to withstand higher levels of voltage stress (i.e., thicker gate oxides exhibit greater junction and gate oxide breakdown voltage levels). Forming drivers using thick gate oxide transistors, however, prohibitively increases circuit area and raises cost (e.g., the driver area may increase by 10× or more).

To reduce circuit area, a positive voltage of +2 V and a negative voltage of −1 V is sometimes used to bias the various terminals of resistive switch 400, which enables the drivers to be formed using thin gate oxide transistors while still providing the requisite 3 V programming level (i.e., +2 V minus−1 V equals 3 V). By splitting the programming voltage between a positive voltage (e.g., +2 V) and a negative voltage (e.g., −1 V), all circuits associated with switch 400 may be implemented using core transistor devices (e.g., transistors having the thinnest gate oxide thickness allowed by the current fabrication design rules or at least a thinner gate oxide than that compared to the IO transistor devices).

In some scenarios such as in the example of FIG. 3, MOS transistor 404 may receive a programming gate (PG) voltage of −1 V at its gate terminal and a programming source (PS) voltage of 2 V at its drain terminal, which turns off transistor 404 but imparts a 3 V voltage drop across the gate and drain terminals of transistor 404. A 3 volt drop across the gate and drain junctions of transistor 404 places a tremendous amount of stress on transistor 404, which can significantly degrade the reliability of transistor 404 over the lifetime of the integrated circuit.

Figure 4:
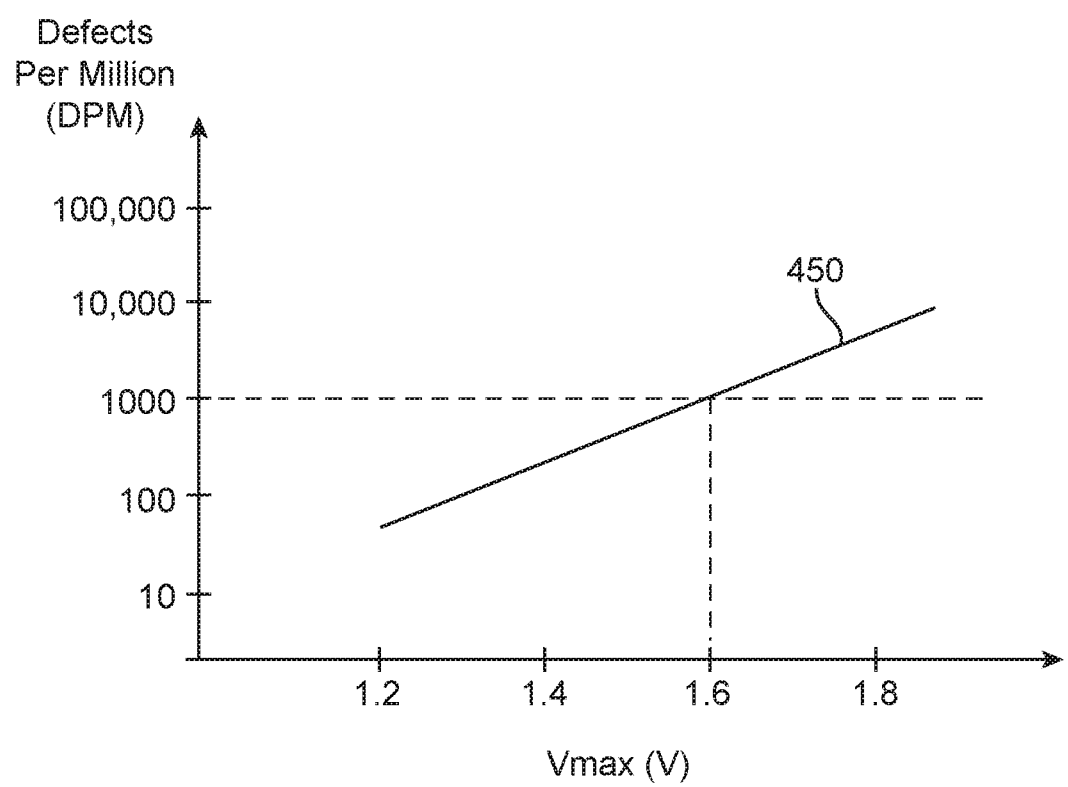
FIG. 4 is a plot of defects per million (DPM) versus the maximum voltage allowed across a transistor junction in accordance with an embodiment.

FIG. 4 is a plot of defects per million (DPM) on a logarithmic scale versus the maximum voltage allowed across a transistor junction. As its name suggests, DPM represents the number of defective transistors in a million transistor samples. Trace 450 maps out the maximum voltage Vmax allowed across a transistor junction (i.e., the maximum gate-to-drain voltage Vgd or the maximum gate-to-source voltage Vgs) to meet the various DPM levels. In the example of FIG. 4, in order to meet a target oxide reliability criteria of 1000 DPM, the maximum voltage Vmax that is allowed across a MOS transistor junction is around 1.6 V. Thus, the biasing scheme shown in FIG. 3 in which transistor 404 is subject to a gate-to-drain voltage Vgd having a magnitude of 3 V would violate the 1000 DPM reliability criteria.

Figure 5:
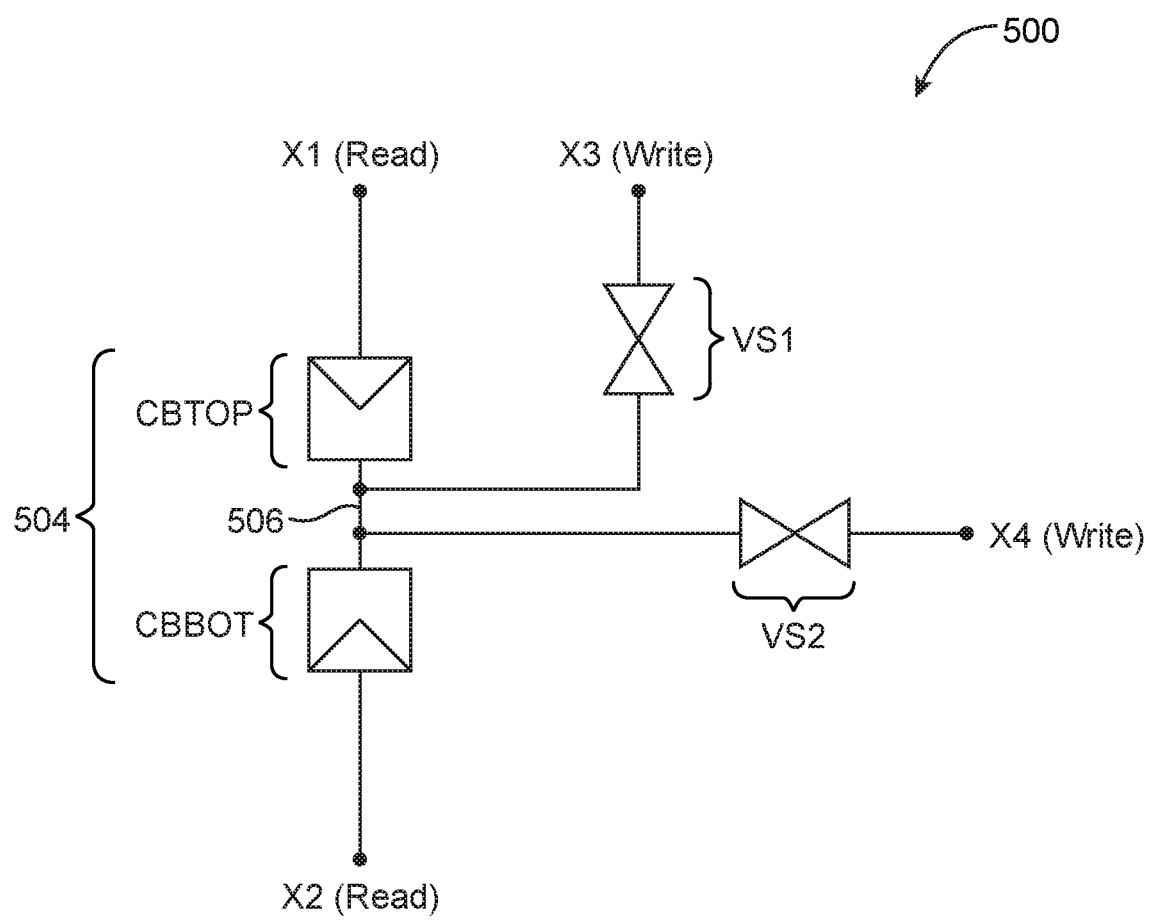
FIG. 5 is a diagram of an illustrative resistive switch element that is programming using varistors in accordance with an embodiment.

In accordance with an embodiment, FIG. 5 shows a programmable resistive switch such as switch 500 that can be programmed using drivers formed from only thin gate oxide transistors without violating the requisite oxide DPM reliability specification. As shown in FIG. 5, programmable resistive switch 500 may include a first (top) non-volatile resistive memory element CBTOP and a second (bottom) non-volatile resistive memory element CBBOT coupled in series between a first terminal X1 and a second terminal X2. In particular, resistive memory element CBTOP may have a first (anode) terminal that is connected to terminal X1 and a second (cathode) terminal that is connected to intermediate node 506. Resistive memory element CBBOT may have a first (anode) terminal that is connected to terminal X2 and a second (cathode) terminal that is connected to node 506. In other words, resistive memory elements CBTOP and CBBOT are connected in a back-to-back configuration. Resistive memory elements CBTOP and CBBOT are sometimes referred to collectively as a complementary switch 504.

Instead of a MOS transistor such as transistor 404 for programming the resistive switch, resistive switch 500 may be selected or programmed using varistors such as varistor VS1 and varistor VS2. A varistor is a voltage-dependent resistor having a non-linear non-ohmic current-voltage characteristic that exhibits diode-like behavior in both directions of current flow (e.g., a varistor may be implemented using a network of back-to-back diode components). In other words, a varistor exhibits high electrical resistance when there is low voltage across its terminals and low electrical resistance when there is high voltage across its terminals.

As shown in in FIG. 5, varistor VS1 has a first terminal coupled to terminal X3 and a second terminal coupled to node 506. Varistor VS2 has a first terminal coupled to terminal X4 and a second terminal coupled to node 506. Configured in this way, terminal X3 serves as a write port for providing programming voltage for setting and resetting resistive memory element CBTOP, whereas terminal X4 serves as a write port for providing programming voltage for setting and resetting resistive memory element CBBOT. Terminals X1 and X2 are along the user path and therefore serve as read ports. As will be described below, using varistors instead of MOS transistors to program resistive switch 500 can eliminate the gate oxide reliability issue resulting from stress on the MOS programming transistor. In addition, the appropriate biasing of the wells and the voltage drop on the varistors can help ensure that all Vgs and Vgd junction voltages of the driver circuits are kept below the desired Vmax of 1.6 V (as an example) to meet the predetermined oxide DPM requirement.

Figure 6A:
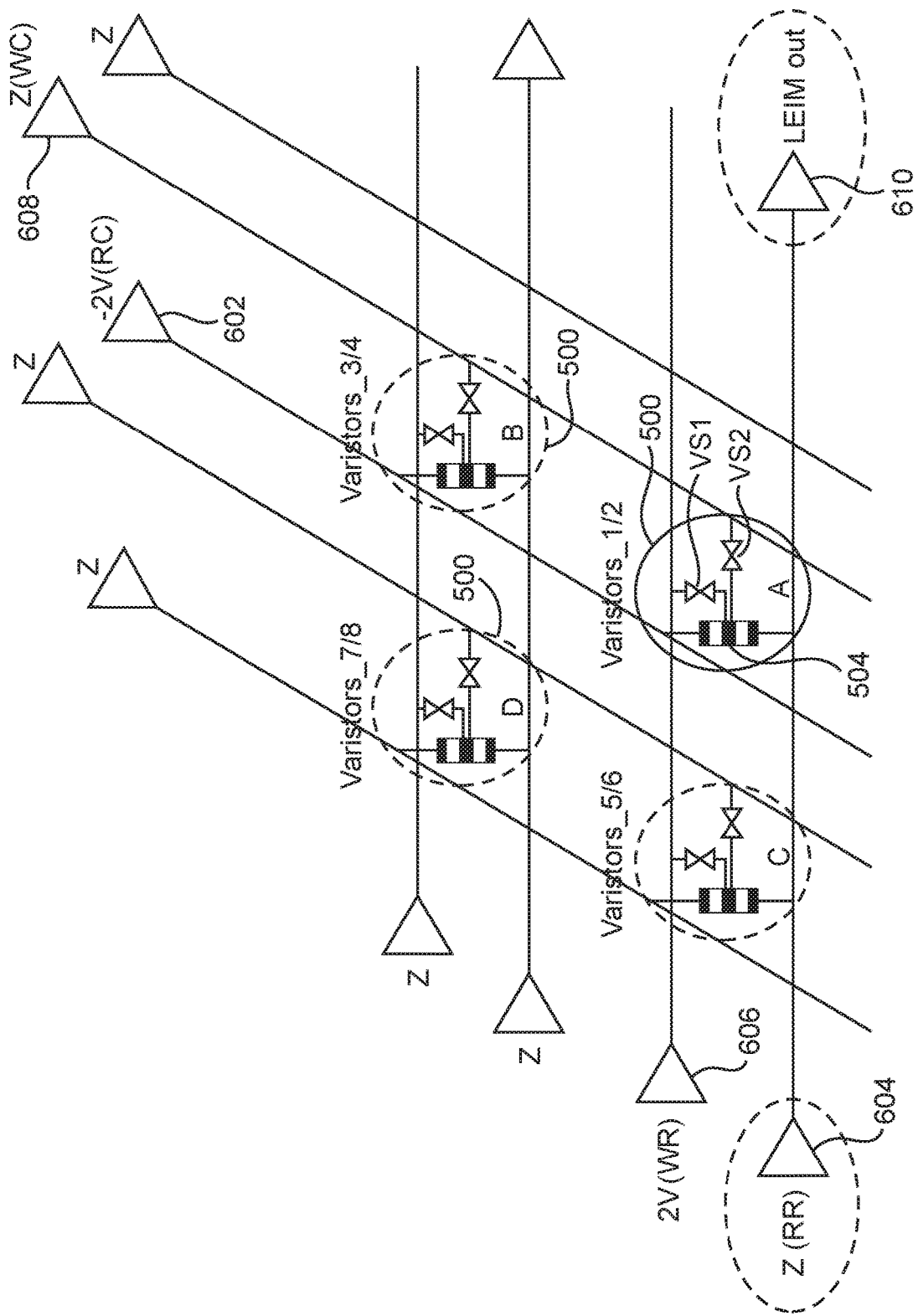
FIG. 6A is a diagram showing how row and column drivers may be configured to reset a top resistive memory element in a selected resistive switch element in an array in accordance with an embodiment.

Programmable resistive switches 500 may be arranged in an array. FIG. 6A is a diagram showing an illustrative array of 2-by-2 resistive switches 500: a first bottom right switch 500 labeled "A" (which are programmed using a first pair of varistors 1/2), a second top right switch 500 labeled "B" (which are programmed using a second pair of varistors 3/4), a third bottom left switch 500 labeled "C" (which are programmed using a third pair of varistors 5/6), and a fourth top left switch 500 labeled "D" (which are programmed using a fourth pair of varistors 7/8). This is merely illustrative. In general, programmable device 10 (FIG. 1) may include hundreds, thousands, or millions of resistive switches 500 arranged in an array of any suitable dimension. FIG. 6A uses a slightly different symbol for complementary switch 504, but it includes resistive memory elements CBTOP and CBBOT connected in same the back-to-back configuration as shown in FIG. 5.

Each resistive switch 500 in the array may be driven using at least four peripheral driver circuits. For instance, resistive switch "A" may be driven using a write row (WR) driver 606, a read row (RR) driver 604, a read column (RC) driver 602, and a write column (WC) driver 608. WR driver 606 may be coupled to write terminal X3 of each resistive switch 500 formed along that particular row, whereas WC driver 608 may be coupled to write terminal X4 of each resistive switch 500 formed along that particular column. RR driver 604 may be coupled to read terminal X2 of each resistive switch 500 formed along that particular row, whereas RC driver 602 may be coupled to read terminal X1 of each resistive switch 500 formed along that particular column. Resistive switches along other rows and columns in the array may be driven using other WR, RR, RC, and WC drivers. Note that all WR, RR, RC, and WC drivers should be tristate buffers, which would allow their outputs to float electrically at high impedance (denoted "Z" in the figures). Moreover, read terminal X2 of each resistive switch along a particular row may be coupled the input of a corresponding line output driver 610. Driver 610 may be configured to route user signals to an input multiplexer of a logic element within device 10 and is therefore sometimes referred to as a logic element input multiplexer or "LEIM" output driver.

In particular, FIG. 6A illustrates how the row and column drivers may be configured to reset the top resistive memory element in a selected resistive switch element such as programmable switch "A" in the array. To reset the top resistive memory element, WR driver 606 may be configured to output +2 V, and RC driver 602 may be configured to output −2 V while all other drivers are placed in tristate mode to avoid disturbing unselected resistive memory elements (i.e., all remaining peripheral driver circuits should be in high impedance mode Z with their outputs electrically floating). Configured in this way, +2 V will be applied to the X3 write terminal while the −2 V will be applied to the anode terminal of the top resistive memory element to program/reset the top resistive memory element in the high resistance state.

Figure 6B:
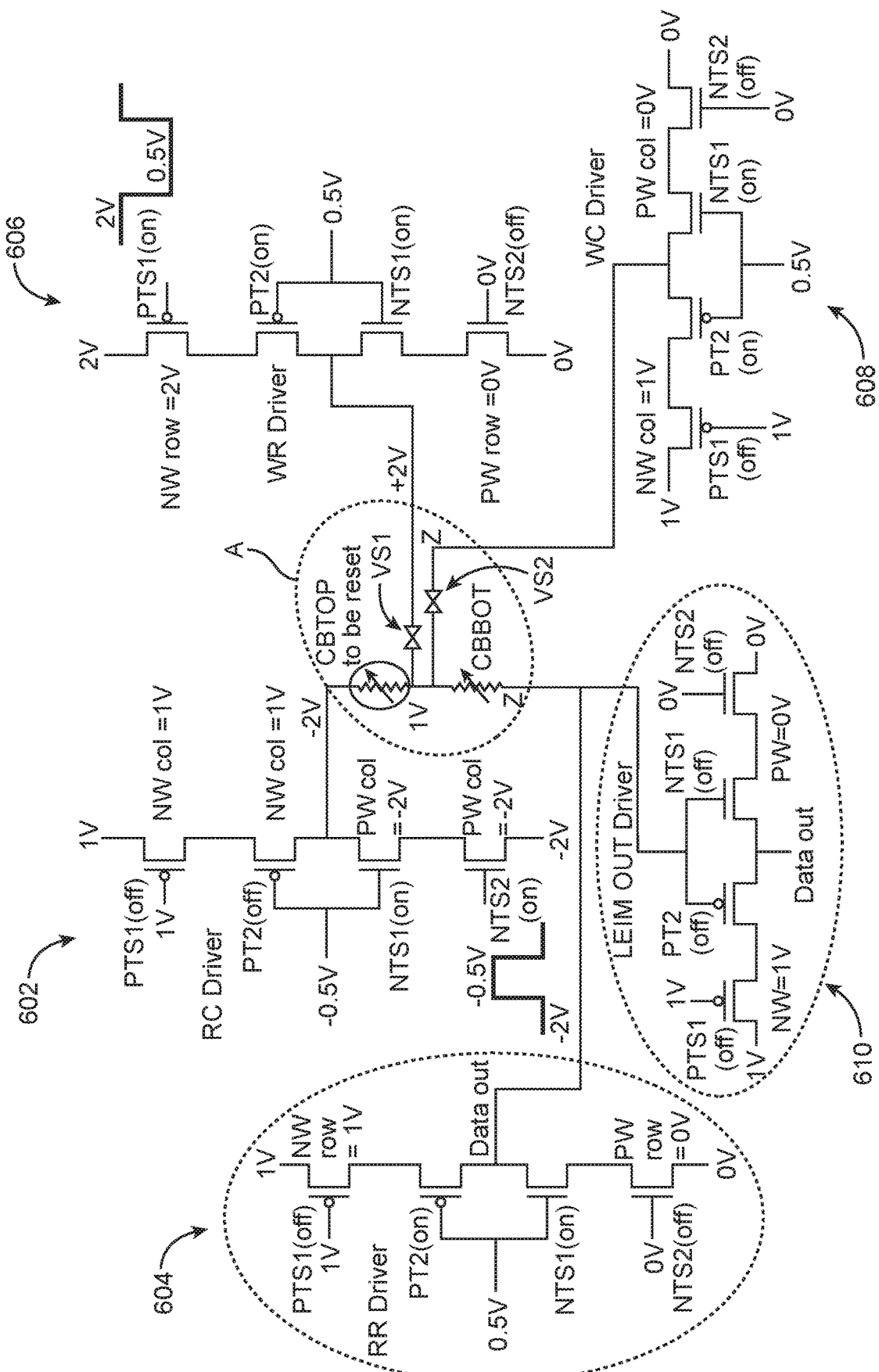
FIG. 6B is a circuit diagram illustrating particular voltage levels for biasing row and column drivers to reset the top resistive memory element in accordance with an embodiment.

FIG. 6B is a circuit diagram illustrating particular voltage levels for biasing the row and column drivers to reset top resistive memory element CBTOP. As shown in FIG. 6B, each of the five drivers 602, 604, 606, 608, and 610 coupled to resistive switch A may be implemented as tristate buffers having pull-up transistors PTS1 and PT2 and pull-down transistors NTS1 and NTS2 connected in series with one another. All of these tristate buffer transistors may be implemented using thin gate oxide transistors to help reduce circuit area.

As described above in connection with FIG. 6A, RR driver 604 and WC driver 608 may be placed in tristate mode. The pull-up path of WR driver 606 may be activated to generate +2 V at its output, thereby applying a +2 V to terminal X3 of varistor VS1. There may be a 1 V voltage drop across varistor VS1, which would then impart +1 V directly at the cathode of memory element CBTOP. The pull-down path of RC driver 602 may be activated to generate −2 V at its output, thereby applying a −2 V to terminal X1 directly at the anode of memory element CBTOP. Operated in this way, a 3 V drop is applied across the anode and cathode of memory element CBTOP to effectively perform a reset operation.

In particular, note that the inputs of drivers 602 and 606 are biased such that all gate-to-source voltages Vgs and gate-to-drain voltages Vgd are maintained below the maximum allowed Vmax of 1.6 V to meet the oxide DPM criteria. This is also true for the other drivers in the high impedance tristate mode. Also note that the n-wells (NW) of the p-channel pull-up transistors and that the p-wells (PW) of the n-channel pull-down transistors are dynamically adjusted such that all drain-to-bulk and source-to-bulk junctions are reversed biased to minimize leakage. Forward biasing any of the drain-to-bulk and source-to-bulk junctions would substantially increase leakage current through the row and column drivers.

Furthermore, the output of WR driver 606 should be driven to +2 V first before the output of RC driver 602 is driven to −2 V. This may be accomplished by pulsing the control signal at the gate of transistor PTS1 in driver 606 before pulsing the control signal at the gate of transistor NTS2 in driver 602. The pulse width of the control signal at the gate of transistor PTS1 in driver 606 should also be wider than the pulse width of the control signal at the gate of transistor NTS2 in driver 602. This ensures that −2 V generated at the output of RC driver 602 is not able to propagate downwards to the output of RR driver 604, to the output of WC driver 608, or to the input of LEIM-OUT driver 610, which could potentially occur when no current is flowing through elements CBTOP and CBBOT and can undesirably expose the thin gate oxide transistors in those drivers to more than the allowed 1.6 Vmax limit.

Thus, configured and operated in this way, resistive switches 500 are much smaller than the CRAM and pass gate combination of FIG. 2; the use of thin gate oxide driver transistors can help avoid significant area increase if thick gate oxide devices were used; and the resistive memory elements CBTOP and CBBOT can help provide SEU immunity and non-volatile characteristics.

Figure 7A:
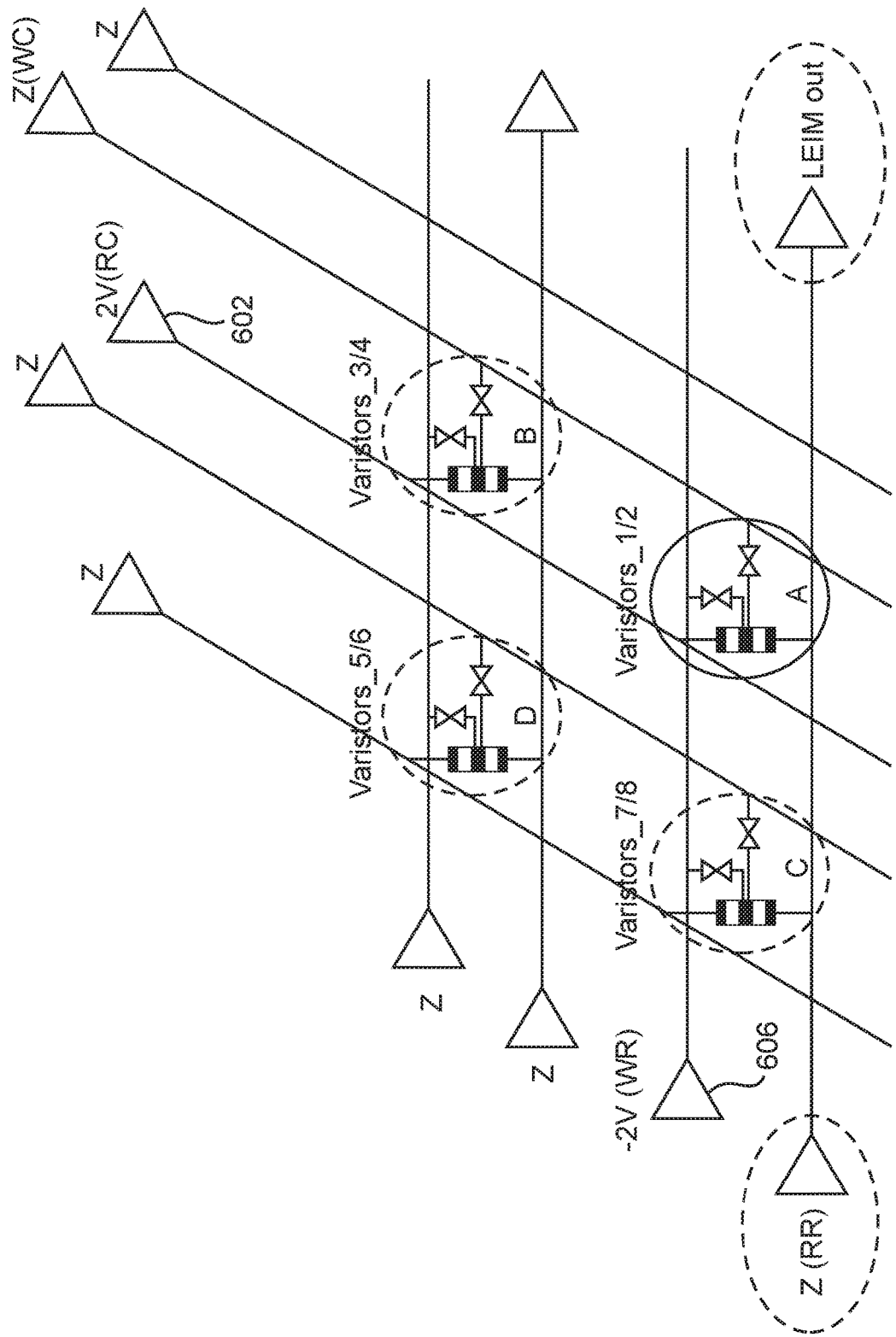
FIG. 7A is a diagram showing how row and column drivers may be configured to set a top resistive memory element in a selected resistive switch element in an array in accordance with an embodiment.

FIG. 7A illustrates how the row and column drivers may be configured to set the top resistive memory element in a selected resistive switch element such as programmable switch "A" in the array. To set the top resistive memory element in low resistance state, WR driver 606 may be configured to output −2 V, and RC driver 602 may be configured to output +2 V while all other drivers are placed in tristate mode to avoid disturbing unselected resistive memory elements (i.e., all remaining peripheral driver circuits should be in high impedance mode Z with their outputs electrically floating). Configured in this way, −2 V will be applied to the X3 write terminal while the +2 V will be applied to the anode terminal of the top resistive memory element to program/set the top resistive memory element in the low resistance state.

Figure 7B:
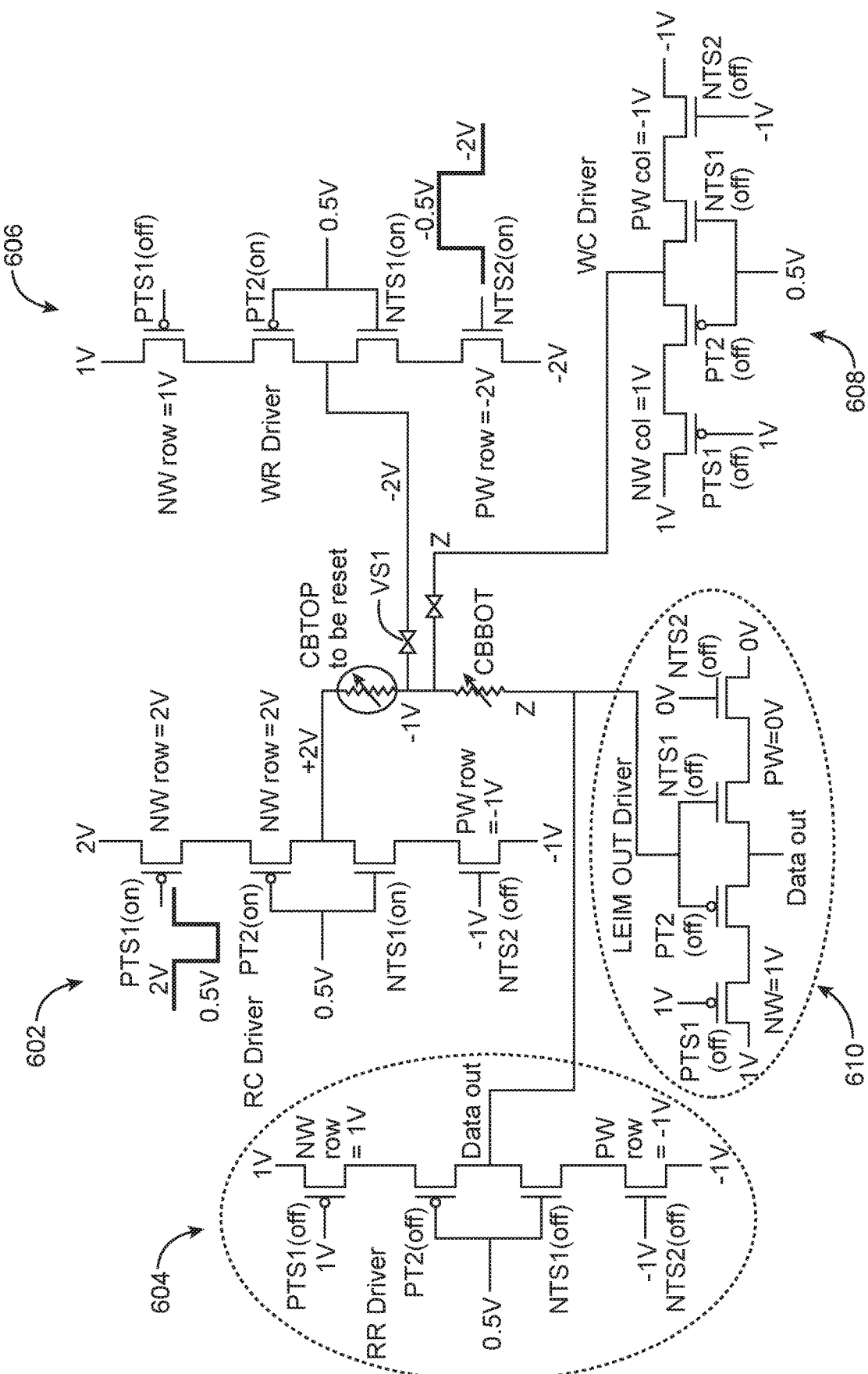
FIG. 7B is a circuit diagram illustrating particular voltage levels for biasing row and column drivers to set the top resistive memory element in accordance with an embodiment.

FIG. 7B is a circuit diagram illustrating particular voltage levels for biasing the row and column drivers to set resistive memory element CBTOP. As described above in connection with FIG. 7A, RR driver 604 and WC driver 608 may be placed in tristate mode.

The pull-down path of WR driver 606 may be activated to generate −2 V at its output, thereby applying a −2 V to terminal X3 of varistor VS1. There may be a 1 V voltage drop across varistor VS1, which would then impart −1 V directly at the cathode of memory element CBTOP. Meanwhile, the pull-up path of RC driver 602 may be activated to generate +2 V at its output, thereby applying +2 V to terminal X1 directly at the anode of memory element CBTOP. Operated in this way, a 3 V drop is applied across the anode and cathode of memory element CBTOP to effectively perform a set operation.

In particular, note that the inputs of drivers 602 and 606 are biased such that all gate-to-source voltages Vgs and gate-to-drain voltages Vgd are maintained below the maximum allowed Vmax of 1.6 V to meet the oxide DPM criteria. This is also true for the other drivers in the high impedance tristate mode. Also note that the n-wells (NW) of the p-channel pull-up transistors and that the p-wells (PW) of the n-channel pull-down transistors are dynamically adjusted such that all drain-to-bulk and source-to-bulk junctions are reversed biased to minimize leakage.

Furthermore, the output of WR driver 606 should be driven to −2 V first before the output of RC driver 602 is driven to +2 V. This may be accomplished by pulsing the control signal at the gate of transistor NTS2 in driver 606 before pulsing the control signal at the gate of transistor PTS1 in driver 602. The pulse width of the control signal at the gate of transistor NTS2 in driver 606 should also be wider than the pulse width of the control signal at the gate of transistor PTS1 in driver 602. This ensures that +2 V generated at the output of RC driver 602 is not able to propagate downwards to the output of RR driver 604, to the output of WC driver 608, or to the input of LEIM-OUT driver 610, which could potentially occur when no current is flowing through elements CBTOP and CBBOT and can undesirably expose the thin gate oxide transistors in those drivers to more than the allowed 1.6 Vmax limit.

Figure 8A:
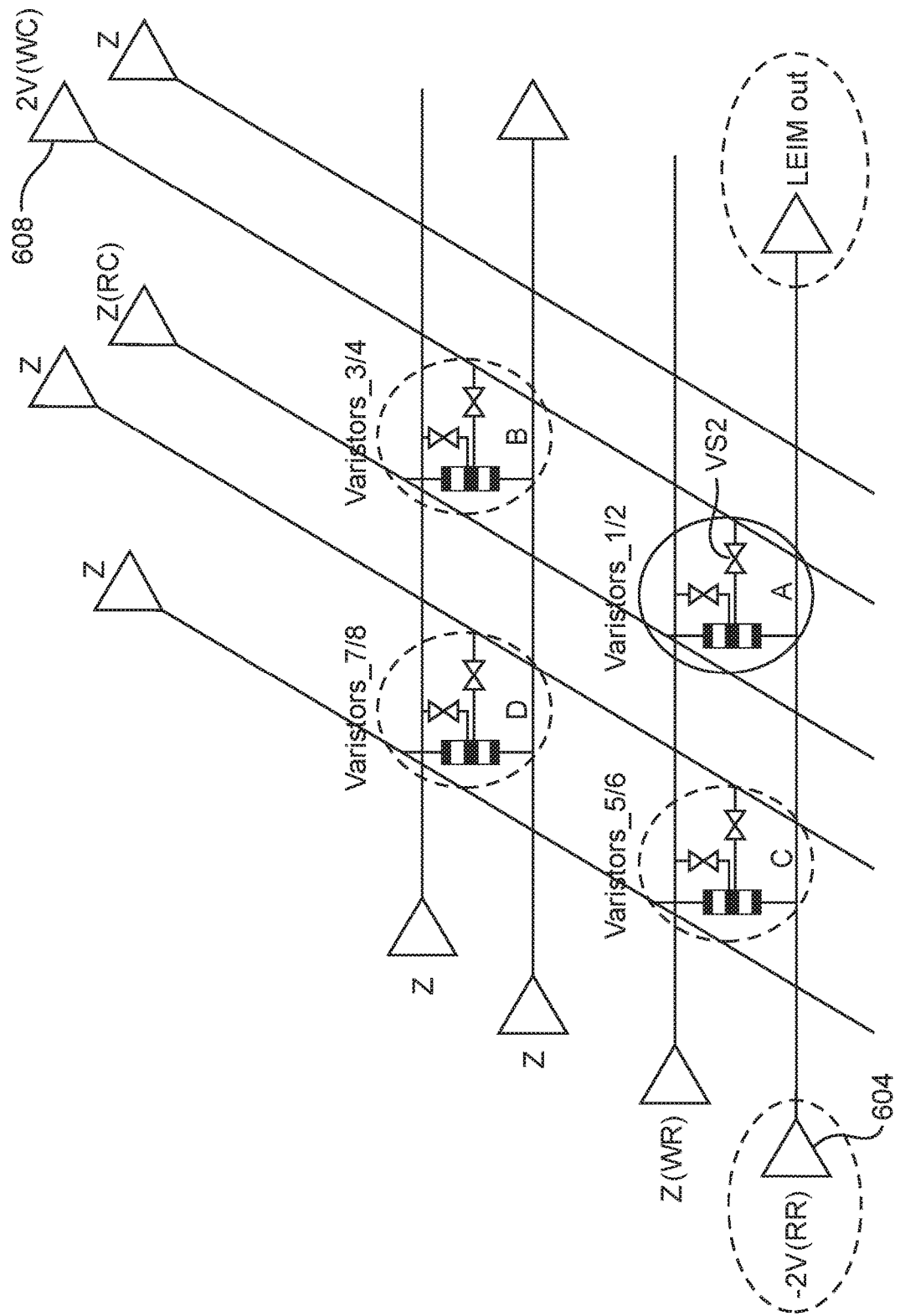
FIG. 8A is a diagram showing how row and column drivers may be configured to reset a bottom resistive memory element in a selected resistive switch element in an array in accordance with an embodiment.

FIG. 8A illustrates how the row and column drivers may be configured to reset the bottom resistive memory element in a selected resistive switch element such as programmable switch "A" in the array. To reset the bottom resistive memory element in high resistance state, RR driver 604 may be configured to output −2 V, and WC driver 608 may be configured to output +2 V while all other drivers are placed in tristate mode to avoid disturbing unselected resistive memory elements (i.e., all remaining peripheral driver circuits should be in high impedance mode Z with their outputs electrically floating). Configured in this way, −2 V will be applied directly to the anode of the bottom resistive memory element while the +2 V will be applied to the X4 write terminal to program/reset the bottom resistive memory element in the high resistance state.

Figure 8B:
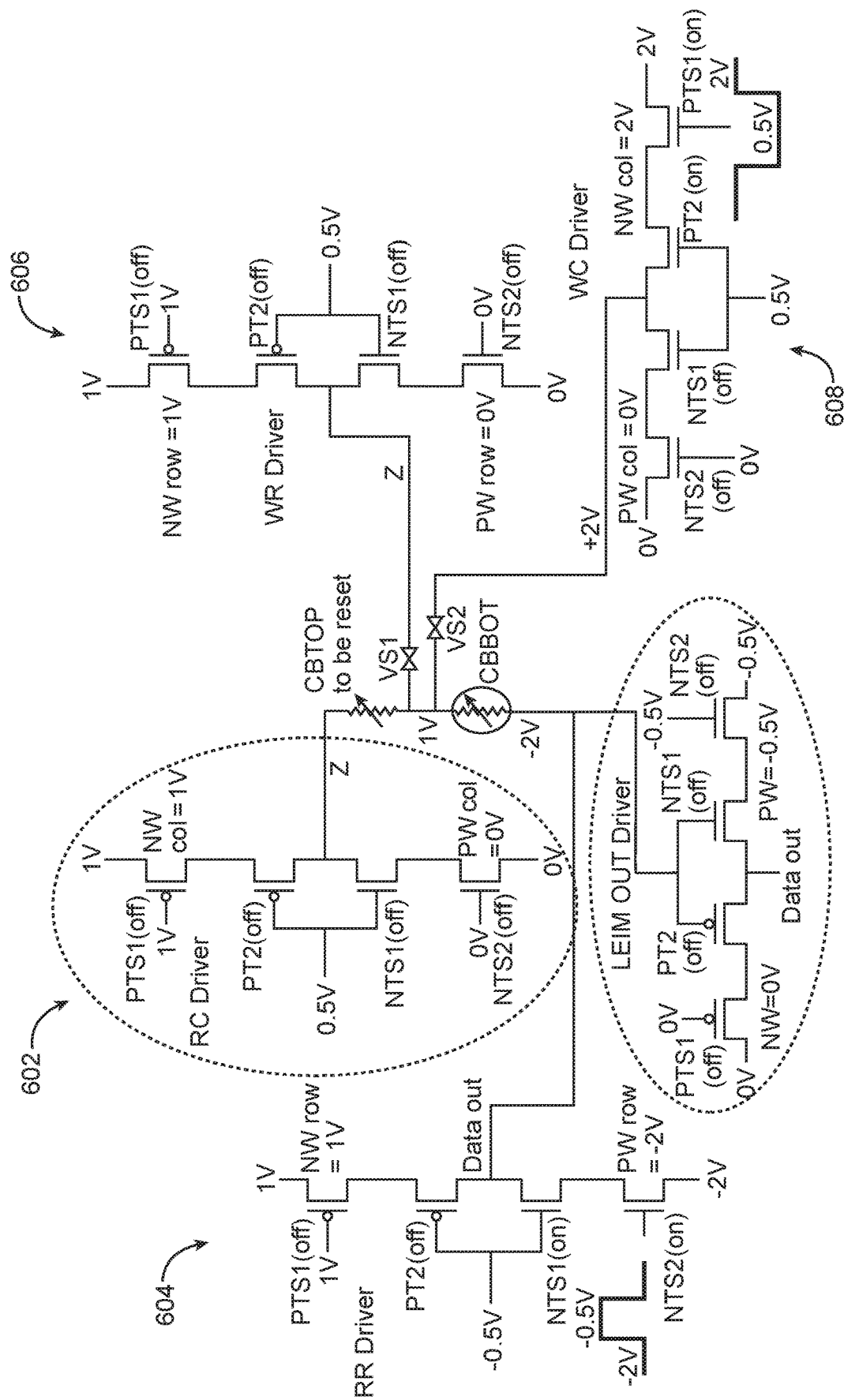
FIG. 8B is a circuit diagram illustrating particular voltage levels for biasing row and column drivers to reset the bottom resistive memory element in accordance with an embodiment.

FIG. 8B is a circuit diagram illustrating particular voltage levels for biasing the row and column drivers to reset resistive memory element CBBOT. As shown in FIG. 8A, RC driver 602 and WR driver 606 may be placed in tristate mode. The pull-up path of WC driver 608 may be activated to generate +2 V at its output, thereby applying a +2 V to terminal X4 of varistor VS2. There may be a 1 V voltage drop across varistor VS2, which would then impart +1 V directly at the cathode of memory element CBBOT. Meanwhile, the pull-down path of RR driver 604 may be activated to generate −2 V at its output, thereby applying −2 V to terminal X2 directly at the anode of memory element CBBOT. Operated in this way, a 3 V drop is applied across the anode and cathode of memory element CBBOT to effectively perform a reset operation.

In particular, note that the inputs of drivers 604 and 608 are biased such that all gate-to-source voltages Vgs and gate-to-drain voltages Vgd are maintained below the maximum allowed Vmax of 1.6 V to meet the oxide DPM criteria. This is also true for the other drivers in the high impedance tristate mode. Also note that the n-wells (NW) of the p-channel pull-up transistors and that the p-wells (PW) of the n-channel pull-down transistors are dynamically adjusted such that all drain-to-bulk and source-to-bulk junctions are reversed biased to minimize leakage.

Furthermore, the output of WC driver 608 should be driven to +2 V first before the output of RR driver 604 is driven to −2 V. This may be accomplished by pulsing the control signal at the gate of transistor PTS1 in driver 608 before pulsing the control signal at the gate of transistor NTS2 in driver 604. The pulse width of the control signal at the gate of transistor PTS1 in driver 608 should also be wider than the pulse width of the control signal at the gate of transistor NTS2 in driver 604. This ensures that −2 V generated at the output of RR driver 604 is not able to propagate upwards to the output of RC driver 602, to the output of WR driver 606, or to the input of LEIM-OUT driver 610, which could potentially occur when no current is flowing through elements CBTOP and CBBOT and can undesirably expose the thin gate oxide transistors in those drivers to more than the allowed 1.6 Vmax limit.

Figure 9A:
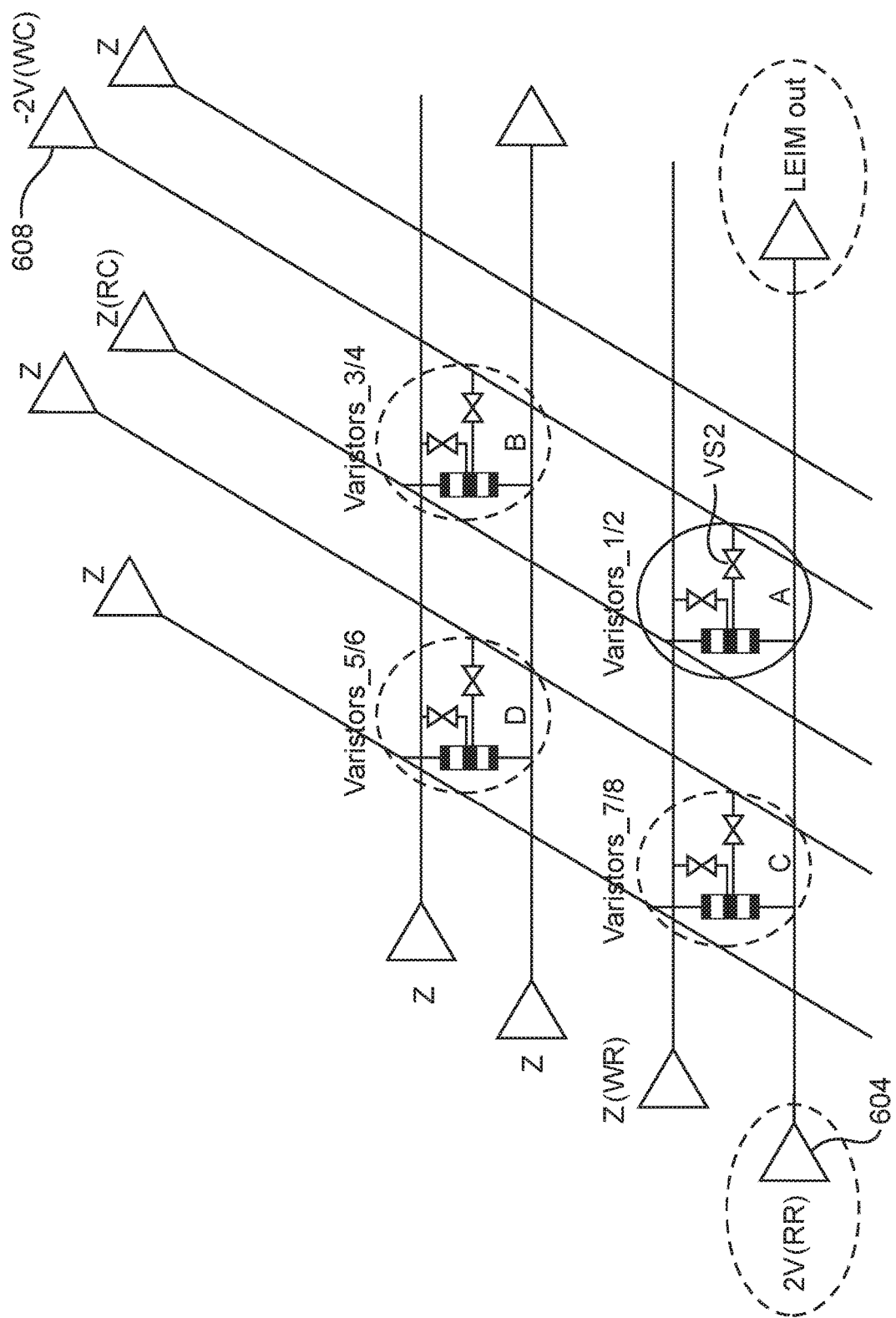
FIG. 9A is a diagram showing how row and column drivers may be configured to set a bottom resistive memory element in a selected resistive switch element in an array in accordance with an embodiment.

FIG. 9A illustrates how the row and column drivers may be configured to set the bottom resistive memory element in a selected resistive switch element such as programmable switch "A" in the array. To set the bottom resistive memory element in the low resistance state, RR driver 604 may be configured to output +2 V, and WC driver 608 may be configured to output −2 V while all other drivers are placed in tristate mode to avoid disturbing unselected resistive memory elements (i.e., all remaining peripheral driver circuits should be in high impedance mode Z with their outputs electrically floating). Configured in this way, +2 V will be applied directly to the anode of the bottom resistive memory element while the −2 V will be applied to the X4 write terminal to program/set the bottom resistive memory element in the low resistance state.

Figure 9B:
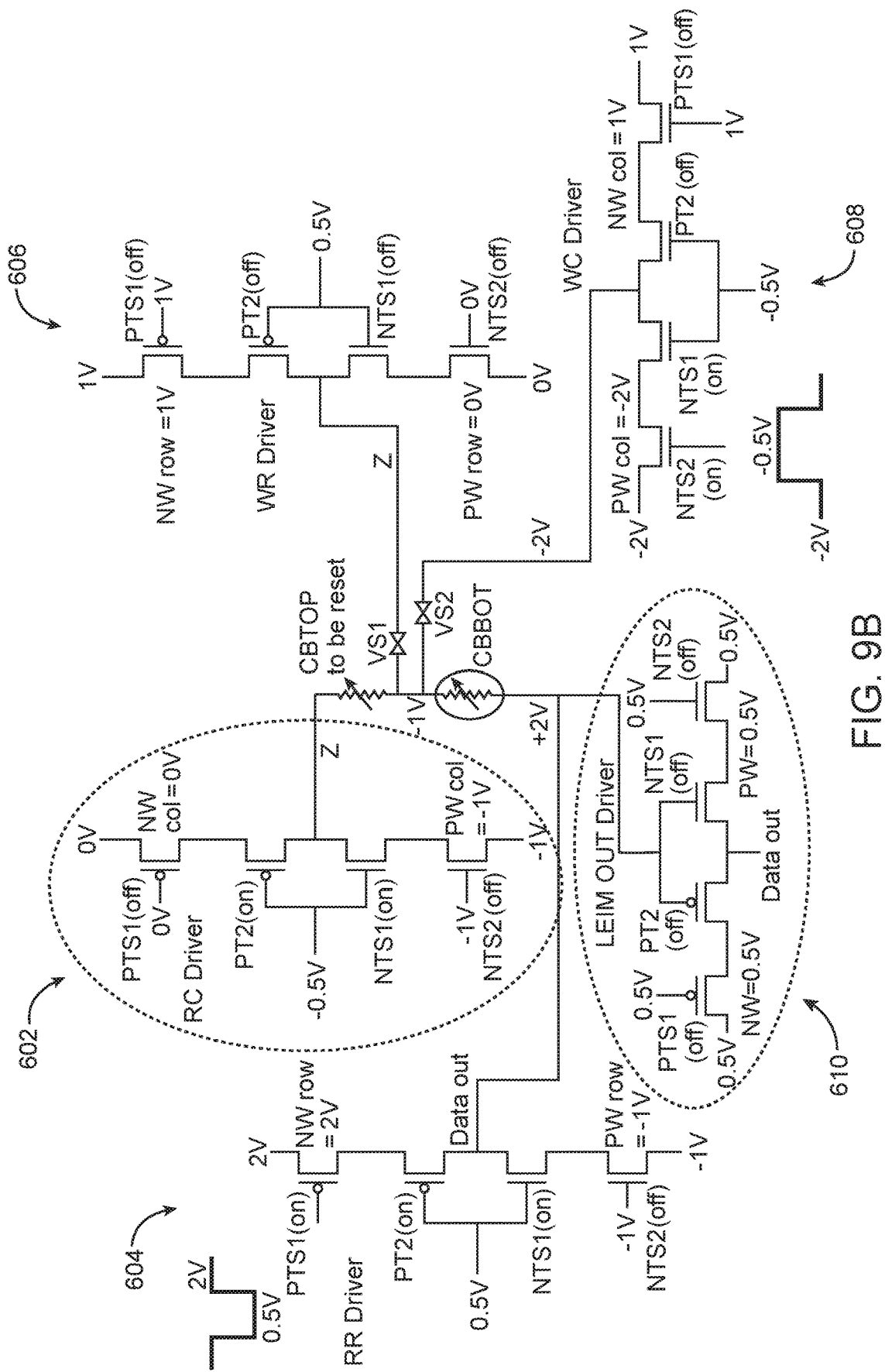
FIG. 9B is a circuit diagram illustrating particular voltage levels for biasing row and column drivers to set the bottom resistive memory element in accordance with an embodiment.

FIG. 9B is a circuit diagram illustrating particular voltage levels for biasing the row and column drivers to set resistive memory element CBBOT. As shown in FIG. 9A, RC driver 602 and WR driver 606 may be placed in tristate mode. The pull-down path of WC driver 608 may be activated to generate −2 V at its output, thereby applying a −2 V to terminal X4 of varistor VS2. There may be a 1 V voltage drop across varistor VS2, which would then impart −1 V directly at the cathode of memory element CBBOT. Meanwhile, the pull-up path of RR driver 604 may be activated to generate +2 V at its output, thereby applying +2 V to terminal X2 directly at the anode of memory element CBBOT. Operated in this way, a 3 V drop is applied across the anode and cathode of memory element CBBOT to effectively perform a set operation.

In particular, note that the inputs of drivers 604 and 608 are biased such that all gate-to-source voltages Vgs and gate-to-drain voltages Vgd are maintained below the maximum allowed Vmax of 1.6 V to meet the oxide DPM criteria. This is also true for the other drivers in the high impedance tristate mode. Also note that the n-wells (NW) of the p-channel pull-up transistors and that the p-wells (PW) of the n-channel pull-down transistors are dynamically adjusted such that all drain-to-bulk and source-to-bulk junctions are reversed biased to minimize leakage.

Furthermore, the output of WC driver 608 should be driven to −2 V first before the output of RR driver 604 is driven to +2 V. This may be accomplished by pulsing the control signal at the gate of transistor NTS2 in driver 608 before pulsing the control signal at the gate of transistor PTS1 in driver 604. The pulse width of the control signal at the gate of transistor NTS2 in driver 608 should also be wider than the pulse width of the control signal at the gate of transistor PTS1 in driver 604. This ensures that +2 V generated at the output of RR driver 604 is not able to propagate upwards to the output of RC driver 602, to the output of WR driver 606, or to the input of LEIM-OUT driver 610, which could potentially occur when no current is flowing through elements CBTOP and CBBOT and can undesirably expose the thin gate oxide transistors in those drivers to more than the allowed 1.6 Vmax limit.

FIGS. 6-9 illustrate how a selected resistive switch "A" in the array may be programmed in the high resistance or low resistance state. This is merely illustrative. In general, the techniques described above may be applied to program or select any one or group of resistive switches 500 in the array.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

EXAMPLES

The following examples pertain to further embodiments.

Example 1 is an integrated circuit, comprising: a programmable resistive switch that comprises: a first non-volatile resistive memory element having an anode and a cathode; a second non-volatile resistive memory element having an anode and a cathode, wherein the cathode of the first non-volatile resistive memory element is directly coupled to the cathode of the second non-volatile resistive memory element; a first varistor connected to the cathode of the first non-volatile resistive memory element; and a second varistor connected to the cathode of the second non-volatile resistive memory element; and driver circuits coupled to the programmable resistive switch, wherein the driver circuits comprise transistors configured to program the first and second non-volatile resistive memory elements while gate-to-source and gate-to-drain junctions of the transistors in the driver circuits are kept below a maximum voltage level that satisfies predetermined gate oxide reliability criteria.

Example 2 is the integrated circuit of example 1, further comprising input-output elements formed using transistors having a first gate oxide thickness, wherein the transistors in the driver circuits have a second gate oxide thickness that is less than the first gate oxide thickness to minimize circuit area.

Example 3 is the integrated circuit of any one of examples 1-2, wherein the transistors in the driver circuits have n-wells and p-wells that are dynamically adjusted while the driver circuits are used to program the first and second non-volatile resistive memory elements to ensure that drain-to-bulk and source-to-bulk junctions of those transistors are always reversed biased to reduce leakage.

Example 4 is the integrated circuit of any one of examples 1-3, wherein the driver circuits comprise: a read column driver having an output coupled to the anode of the first non-volatile resistive memory element; and a read row driver having an output coupled to the anode of the second non-volatile resistive memory element.

Example 5 is the integrated circuit of example 4, wherein the driver circuits further comprise: a write row driver having an output coupled to the first varistor; and a write column driver having an output coupled to the second varistor.

Example 6 is the integrated circuit of example 5, wherein the driver circuits are all tristate buffers.

Example 7 is the integrated circuit of example 6, wherein the read column driver is configured to output a negative voltage while the write row driver is configured to output a positive voltage to reset the first non-volatile resistive memory element to a high resistance state, and wherein the write row driver is configured to output the positive voltage before the read column driver is configured to output the negative voltage.

Example 8 is the integrated circuit of example 7, wherein the read column driver is configured to output the positive voltage while the write row driver is configured to output the negative voltage to set the first non-volatile resistive memory element to a low resistance state, and wherein the write row driver is configured to output the negative voltage before the read column driver is configured to output the positive voltage.

Example 9 is the integrated circuit of example 6, wherein the read row driver is configured to output a negative voltage while the write column driver is configured to output a positive voltage to reset the second non-volatile resistive memory element to a high resistance state, and wherein the write column driver is configured to output the positive voltage before the read row driver is configured to output the negative voltage.

Example 10 is the integrated circuit of example 9, wherein the read row driver is configured to output the positive voltage while the write column driver is configured to output the negative voltage to set the second non-volatile resistive memory element to a low resistance state, and wherein the write column driver is configured to output the negative voltage before the read row driver is configured to output the positive voltage.

Example 11 is a method of operating an integrated circuit that includes a programmable resistive switch having a first non-volatile resistive memory element, a second non-volatile resistive memory element, a first varistor, and a second varistor, the method comprising: using the first varistor to program the first non-volatile resistor memory element; using the second varistor to program the second non-volatile resistor memory element; and using driver circuits to apply programming voltages onto the first and second varistors while gate-to-source and gate-to-drain junctions of transistors within the driver circuits are kept below a target voltage level that meets transistor reliability criteria.

Example 12 is the method of example, wherein using the driver circuits to apply the programming voltages onto the first and second varistors comprises: resetting the first non-volatile resistive memory element to a high resistance state by: using a read column driver in the driver circuits to output a negative voltage to an anode of the first non-volatile resistive memory element, wherein the read column driver receives a first control signal with a first pulse width; using a write row driver in the driver circuits to output a positive voltage directly to the first varistor, wherein the write row driver receives a second control with a second pulse width that is greater than the first pulse width; placing a read row driver in the driver circuits in a high impedance mode; and placing a write column driver in the driver circuits in the high impedance mode.

Example 13 is the method of example 12, wherein using the driver circuits to apply the programming voltages onto the first and second varistors further comprises setting the first non-volatile resistive memory element to a low resistance state by: using the read column driver in the driver circuits to output the positive voltage to the anode of the first non-volatile resistive memory element, wherein the read column driver receives a third control signal with third first pulse width; using the write row driver in the driver circuits to output the negative voltage directly to the first varistor, wherein the write row driver receives a fourth control with a fourth pulse width that is greater than the third pulse width;

and placing the read row driver and the write column driver in the driver circuits in the high impedance mode.

Example 14 is the method of example 13, wherein using the driver circuits to apply the programming voltages onto the first and second varistors further comprises resetting the second non-volatile resistive memory element to the high resistance state by: using the read row driver in the driver circuits to output the negative voltage to the anode of the second non-volatile resistive memory element, wherein the read row driver receives a fifth control signal with fifth first pulse width; using the write column driver in the driver circuits to output the positive voltage directly to the second varistor, wherein the write column driver receives a sixth control with a sixth pulse width that is greater than the fifth pulse width; and placing the read column driver and the write row driver in the driver circuits in the high impedance mode.

Example 15 is the method of example 14, wherein using the driver circuits to apply the programming voltages onto the first and second varistors further comprises setting the second non-volatile resistive memory element to the low resistance state by: using the read row driver in the driver circuits to output the positive voltage to the anode of the second non-volatile resistive memory element, wherein the read row driver receives a seventh control signal with seventh first pulse width; using the write column driver in the driver circuits to output the negative voltage directly to the second varistor, wherein the write column driver receives an eighth control with an eighth pulse width that is greater than the seventh pulse width; and placing the read column driver and the write row driver in the driver circuits in the high impedance mode.

Example 16 is an integrated circuit, comprising: an array of resistive switches, wherein each resistive switch in the array comprises a top non-volatile resistive memory element, a bottom non-volatile resistive memory element coupled in series with the top non-volatile resistive memory element, a first varistor operable to program the top non-volatile resistive memory element, and a second varistor operable to program the bottom non-volatile resistive memory element; a write row driver coupled to the first varistor in each resistive switch formed along a given row in the array; a read row driver coupled to an anode of the bottom non-volatile resistive memory element in each resistive switch formed along the given row in the array; a write column driver coupled to the second varistor in each resistive switch formed along a given column in the array; and a read column driver coupled to an anode of the top non-volatile resistive memory element in each resistive switch formed along the given column in the array.

Example 17 is the integrated circuit of example 16, wherein the write row driver, the read row driver, the write column driver, and the read column driver have transistors configured to program the top and bottom non-volatile resistive memory elements in a selected resistive switch in the array while gate-to-source and gate-to-drain junctions of those transistors do not exceed a target voltage level that satisfies a defects per million (DPM) reliability specification.

Example 18 is the integrated circuit of any one of examples 16-17, further comprising input-output elements formed using transistors having a first gate oxide thickness, wherein the transistors in the write row driver, the read row driver, the write column driver, and the read column driver have a second gate oxide thickness that is less than the first gate oxide thickness to minimize circuit area.

Example 19 is the integrated circuit of any one of examples 16-18, wherein the write row driver, the read row driver, the write column driver, and the read column driver are all tristate buffers, and wherein during programming, one of the four drivers is configured to output a positive voltage, another one of the four drivers is configured to output a negative voltage, and the remaining two drivers in the four drivers are configured in a tristate mode.

Example 20 is the integrated circuit of any one of examples 16-19, wherein the write row driver, the read row driver, the write column driver, and the read column driver have transistors with n-wells and p-wells that are dynamically adjusted to ensure that drain-to-bulk and source-to-bulk junctions of those transistors are always reversed biased to reduce leakage.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. An integrated circuit, comprising:
    a programmable resistive switch that comprises:
        a first non-volatile resistive memory element having an anode and a cathode;
        a second non-volatile resistive memory element having an anode and a cathode, wherein the cathode of the first non-volatile resistive memory element is directly coupled to the cathode of the second non-volatile resistive memory element;
        a first varistor connected to the cathode of the first non-volatile resistive memory element; and
        a second varistor connected to the cathode of the second non-volatile resistive memory element; and
    driver circuits coupled to the programmable resistive switch, wherein the driver circuits comprise transistors configured to program the first and second non-volatile resistive memory elements while gate-to-source and gate-to-drain junctions of the transistors in the driver circuits are kept below a maximum voltage level that satisfies predetermined gate oxide reliability criteria.

2. The integrated circuit of claim 1, further comprising:
    input-output elements formed using transistors having a first gate oxide thickness, wherein the transistors in the driver circuits have a second gate oxide thickness that is less than the first gate oxide thickness to minimize circuit area.

3. The integrated circuit of claim 1, wherein the transistors in the driver circuits have n-wells and p-wells that are dynamically adjusted while the driver circuits are used to program the first and second non-volatile resistive memory elements to ensure that drain-to-bulk and source-to-bulk junctions of those transistors are always reversed biased to reduce leakage.

4. The integrated circuit of claim 1, wherein the driver circuits comprise:
    a read column driver having an output coupled to the anode of the first non-volatile resistive memory element; and
    a read row driver having an output coupled to the anode of the second non-volatile resistive memory element.

5. The integrated circuit of claim 4, wherein the driver circuits further comprise:
    a write row driver having an output coupled to the first varistor; and a write column driver having an output coupled to the second varistor.

6. The integrated circuit of claim 5, wherein the driver circuits are all tristate buffers.

7. The integrated circuit of claim 6, wherein the read column driver is configured to output a negative voltage while the write row driver is configured to output a positive voltage to reset the first non-volatile resistive memory element to a high resistance state, and wherein the write row driver is configured to output the positive voltage before the read column driver is configured to output the negative voltage.

8. The integrated circuit of claim 7, wherein the read column driver is configured to output the positive voltage while the write row driver is configured to output the negative voltage to set the first non-volatile resistive memory element to a low resistance state, and wherein the write row driver is configured to output the negative voltage before the read column driver is configured to output the positive voltage.

9. The integrated circuit of claim 6, wherein the read row driver is configured to output a negative voltage while the write column driver is configured to output a positive voltage to reset the second non-volatile resistive memory element to a high resistance state, and wherein the write column driver is configured to output the positive voltage before the read row driver is configured to output the negative voltage.

10. The integrated circuit of claim 9, wherein the read row driver is configured to output the positive voltage while the write column driver is configured to output the negative voltage to set the second non-volatile resistive memory element to a low resistance state, and wherein the write column driver is configured to output the negative voltage before the read row driver is configured to output the positive voltage.

11. A method for operating an integrated circuit that includes a programmable resistive switch having a first non-volatile resistive memory element, a second non-volatile resistive memory element, a first varistor, and a second varistor, the method comprising:
using the first varistor to program the first non-volatile resistor memory element;
using the second varistor to program the second non-volatile resistor memory element; and
using driver circuits to apply programming voltages onto the first and second varistors while gate-to-source and gate-to-drain junctions of transistors within the driver circuits are kept below a target voltage level that meets transistor reliability criteria.

12. The method of claim 11, wherein using the driver circuits to apply the programming voltages onto the first and second varistors comprises:
resetting the first non-volatile resistive memory element to a high resistance state by:
using a read column driver in the driver circuits to output a negative voltage to an anode of the first non-volatile resistive memory element, wherein the read column driver receives a first control signal with a first pulse width;
using a write row driver in the driver circuits to output a positive voltage directly to the first varistor, wherein the write row driver receives a second control signal with a second pulse width that is greater than the first pulse width;
placing a read row driver in the driver circuits in a high impedance mode; and placing a write column driver in the driver circuits in the high impedance mode.

13. The method of claim 12, wherein using the driver circuits to apply the programming voltages onto the first and second varistors further comprises:
setting the first non-volatile resistive memory element to a low resistance state by:
using the read column driver in the driver circuits to output the positive voltage to the anode of the first non-volatile resistive memory element, wherein the read column driver receives a third control signal with a third pulse width;
using the write row driver in the driver circuits to output the negative voltage directly to the first varistor, wherein the write row driver receives a fourth control signal with a fourth pulse width that is greater than the third pulse width; and
placing the read row driver and the write column driver in the driver circuits in the high impedance mode.

14. The method of claim 13, wherein using the driver circuits to apply the programming voltages onto the first and second varistors further comprises:
resetting the second non-volatile resistive memory element to the high resistance state by:
using the read row driver in the driver circuits to output the negative voltage to the anode of the second non-volatile resistive memory element, wherein the read row driver receives a fifth control signal with a fifth pulse width;
using the write column driver in the driver circuits to output the positive voltage directly to the second varistor, wherein the write column driver receives a sixth control signal with a sixth pulse width that is greater than the fifth pulse width; and
placing the read column driver and the write row driver in the driver circuits in the high impedance mode.

15. The method of claim 14, wherein using the driver circuits to apply the programming voltages onto the first and second varistors further comprises:
setting the second non-volatile resistive memory element to the low resistance state by:
using the read row driver in the driver circuits to output the positive voltage to the anode of the second non-volatile resistive memory element, wherein the read row driver receives a seventh control signal with a seventh pulse width;
using the write column driver in the driver circuits to output the negative voltage directly to the second varistor, wherein the write column driver receives an eighth control signal with an eighth pulse width that is greater than the seventh pulse width; and
placing the read column driver and the write row driver in the driver circuits in the high impedance mode.

16. An integrated circuit, comprising:
an array of resistive switches, wherein each resistive switch in the array comprises a top non-volatile resistive memory element, a bottom non-volatile resistive memory element coupled in series with the top non-volatile resistive memory element, a first varistor operable to program the top non-volatile resistive memory element, and a second varistor operable to program the bottom non-volatile resistive memory element;
a write row driver coupled to the first varistor in each resistive switch formed along a given row in the array;
a read row driver coupled to an anode of the bottom non-volatile resistive memory element in each resistive switch formed along the given row in the array;

a write column driver coupled to the second varistor in each resistive switch formed along a given column in the array; and a read column driver coupled to an anode of the top non-volatile resistive memory element in each resistive switch formed along the given column in the array.

17. The integrated circuit of claim 16, wherein the write row driver, the read row driver, the write column driver, and the read column driver have transistors configured to program the top and bottom non-volatile resistive memory elements in a selected resistive switch in the array while gate-to-source and gate-to-drain junctions of those transistors do not exceed a target voltage level that satisfies a defects per million (DPM) reliability specification.

18. The integrated circuit of claim 16, further comprising: input-output elements formed using transistors having a first gate oxide thickness, wherein the transistors in the write row driver, the read row driver, the write column driver, and the read column driver have a second gate oxide thickness that is less than the first gate oxide thickness to minimize circuit area.

19. The integrated circuit of claim 16, wherein the write row driver, the read row driver, the write column driver, and the read column driver are all tristate buffers, and wherein during programming, one of the four drivers is configured to output a positive voltage, another one of the four drivers is configured to output a negative voltage, and the remaining two drivers in the four drivers are configured in a tristate mode.

20. The integrated circuit of claim 16, wherein the write row driver, the read row driver, the write column driver, and the read column driver have transistors with n-wells and p-wells that are dynamically adjusted to ensure that drain-to-bulk and source-to-bulk junctions of those transistors are always reversed biased to reduce leakage.

* * * * *